United States Patent
Yu et al.

(10) Patent No.: US 11,133,274 B2
(45) Date of Patent: *Sep. 28, 2021

(54) FAN-OUT INTERCONNECT STRUCTURE AND METHOD FOR FORMING SAME

(71) Applicant: Taiwan Semiconductor Manufacturing Co., Ltd., Hsinchu (TW)

(72) Inventors: Chen-Hua Yu, Hsinchu (TW); Yen-Chang Hu, Tai-Chung (TW); Ching-Wen Hsiao, Hsinchu (TW); Mirng-Ji Lii, Sinpu Township (TW); Chung-Shi Liu, Hsinchu (TW); Chien Ling Hwang, Hsinchu (TW); Chih-Wei Lin, Zhubei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/915,780

(22) Filed: Jun. 29, 2020

(65) Prior Publication Data

US 2020/0328169 A1 Oct. 15, 2020

Related U.S. Application Data

(60) Continuation of application No. 15/177,119, filed on Jun. 8, 2016, now Pat. No. 10,700,025, which is a
(Continued)

(51) Int. Cl.
*H01L 23/00* (2006.01)
*H01L 23/29* (2006.01)
(Continued)

(52) U.S. Cl.
CPC ............ *H01L 24/02* (2013.01); *H01L 21/561* (2013.01); *H01L 23/293* (2013.01);
(Continued)

(58) Field of Classification Search
CPC ......... H01L 21/7688; H01L 2221/1026; H01L 2221/1063; H01L 2221/03001; H01L 2224/82002; H01L 2224/19
See application file for complete search history.

(56) References Cited

U.S. PATENT DOCUMENTS 5,870,289 A 2/1999 Tokuda et al.
5,902,686 A 5/1999 Mis
(Continued)

FOREIGN PATENT DOCUMENTS

CN 101584033 A 11/2009
CN 102347251 A 2/2012
(Continued)

OTHER PUBLICATIONS

Cepheiden, "Cmos-chip structure in 2000s (en)", Wikiepedia, Dec. 9, 2006, https://en.wikipedia.org/wiki/File:Cmos-chip_structure_in_2000s_(en).svg.
(Continued)

*Primary Examiner* — Vincent Wall
(74) *Attorney, Agent, or Firm* — Slater Matsil, LLP

(57) ABSTRACT

A method embodiment includes forming a sacrificial film layer over a top surface of a die, the die having a contact pad at the top surface. The die is attached to a carrier, and a molding compound is formed over the die and the sacrificial film layer. The molding compound extends along sidewalls of the die. The sacrificial film layer is exposed. The contact pad is exposed by removing at least a portion of the sacrificial film layer. A first polymer layer is formed over the
(Continued)

US 11,133,274 B2

Page 2 die, and a redistribution layer (RDL) is formed over the die and electrically connects to the contact pad.

20 Claims, 13 Drawing Sheets

Related U.S. Application Data division of application No. 13/937,726, filed on Jul. 9, 2013, now Pat. No. 9,368,460.

(60) Provisional application No. 61/793,930, filed on Mar. 15, 2013.

(51) Int. Cl.
  *H01L 23/31* (2006.01)
  *H01L 21/56* (2006.01)
  *H01L 23/538* (2006.01)
  *H01L 23/525* (2006.01)

(52) U.S. Cl.
  CPC ...... *H01L 23/3185* (2013.01); *H01L 23/3192* (2013.01); *H01L 23/5389* (2013.01); *H01L 24/05* (2013.01); *H01L 24/13* (2013.01); *H01L 24/19* (2013.01); *H01L 24/96* (2013.01); *H01L 24/97* (2013.01); *H01L 21/568* (2013.01); *H01L 23/525* (2013.01); *H01L 24/03* (2013.01); *H01L 2224/024* (2013.01); *H01L 2224/0231* (2013.01); *H01L 2224/0235* (2013.01); *H01L 2224/02315* (2013.01); *H01L 2224/02379* (2013.01); *H01L 2224/02381* (2013.01); *H01L 2224/0401* (2013.01); *H01L 2224/04105* (2013.01); *H01L 2224/05008* (2013.01); *H01L 2224/05016* (2013.01); *H01L 2224/05017* (2013.01); *H01L 2224/05022* (2013.01); *H01L 2224/05124* (2013.01); *H01L 2224/05144* (2013.01); *H01L 2224/05147* (2013.01); *H01L 2224/05567* (2013.01); *H01L 2224/05573* (2013.01); *H01L 2224/05647* (2013.01); *H01L 2224/05666* (2013.01); *H01L 2224/11002* (2013.01); *H01L 2224/12105* (2013.01); *H01L 2224/13007* (2013.01); *H01L 2224/13024* (2013.01); *H01L 2224/13111* (2013.01); *H01L 2224/1411* (2013.01); *H01L 2224/97* (2013.01); *H01L 2924/181* (2013.01); *H01L 2924/18162* (2013.01)

(56) References Cited

U.S. PATENT DOCUMENTS

| | | |
|---|---|---|
| 6,168,992 B1 | 1/2001 | Lee |
| 6,433,427 B1 | 8/2002 | Wu et al. |
| 6,515,369 B1 | 2/2003 | Lin |
| 6,528,349 B1 | 3/2003 | Patel et al. |
| 6,746,898 B2 | 6/2004 | Lin et al. |
| 6,972,964 B2 | 12/2005 | Ho et al. |
| 7,170,162 B2 | 1/2007 | Chang |
| 7,276,783 B2 | 10/2007 | Goller et al. |
| 7,368,374 B2 | 5/2008 | Chia et al. |
| 7,397,000 B2 | 7/2008 | Shimoto et al. |
| 7,485,956 B2 | 2/2009 | Tuckerman et al. |
| 7,498,196 B2 | 3/2009 | Lee et al. |
| 7,582,556 B2 | 9/2009 | Lin et al. |
| 7,749,886 B2 | 7/2010 | Oganesian et al. |
| 7,755,151 B2 | 7/2010 | Lim et al. |
| 7,863,721 B2 | 1/2011 | Suthiwongsunthom et al. |
| 7,883,991 B1 | 2/2011 | Wu et al. |
| 7,906,860 B2 | 3/2011 | Meyer et al. |
| 8,003,512 B2 | 8/2011 | Belanger et al. |
| 8,008,125 B2 | 8/2011 | McConnelee et al. |
| 8,039,315 B2 | 10/2011 | Lee et al. |
| 8,114,708 B2 | 2/2012 | McConnelee et al. |
| 8,163,596 B2 | 4/2012 | Kapusta et al. |
| 8,178,435 B2 | 5/2012 | Lin |
| 8,187,965 B2 | 5/2012 | Lin et al. |
| 8,216,881 B2 | 7/2012 | Beer et al. |
| 8,258,624 B2 | 9/2012 | Beer et al. |
| 8,300,423 B1 | 10/2012 | Darveaux et al. |
| 8,361,842 B2 | 1/2013 | Yu et al. |
| 8,373,272 B2 | 2/2013 | Liu et al. |
| 8,580,614 B2 | 11/2013 | Yu et al. |
| 8,829,666 B2 | 9/2014 | Ng et al. |
| 8,993,380 B2 | 3/2015 | Hou et al. |
| 9,443,783 B2 | 9/2016 | Lin et al. |
| 9,461,018 B1 | 10/2016 | Tsai et al. |
| 9,553,000 B2 | 1/2017 | Yu et al. |
| 2001/0011764 A1 | 8/2001 | Elenius et al. |
| 2002/0064922 A1 | 5/2002 | Lin |
| 2002/0093107 A1 | 7/2002 | Wu et al. |
| 2003/0017647 A1 | 1/2003 | Kwon et al. |
| 2003/0071326 A1 | 4/2003 | Lin |
| 2003/0092274 A1 | 5/2003 | Brintzinger |
| 2003/0222352 A1 | 12/2003 | Kung et al. |
| 2004/0094841 A1 | 5/2004 | Matsuzaki et al. |
| 2004/0232543 A1 | 11/2004 | Goller et al. |
| 2006/0073638 A1 | 4/2006 | Hsu |
| 2006/0103020 A1 | 5/2006 | Tong et al. |
| 2006/0291029 A1 | 12/2006 | Lin et al. |
| 2007/0126127 A1 | 6/2007 | Jobetto et al. |
| 2007/0170577 A1 | 7/2007 | Dangelmaier et al. |
| 2007/0236859 A1 | 10/2007 | Borland et al. |
| 2007/0267743 A1 | 11/2007 | Mizusawa et al. |
| 2007/0290379 A1 | 12/2007 | Dueber et al. |
| 2007/0291440 A1 | 12/2007 | Dueber et al. |
| 2008/0150121 A1 | 6/2008 | Oganesian et al. |
| 2009/0020864 A1 | 1/2009 | Pu et al. |
| 2009/0243081 A1 | 10/2009 | Kapusta et al. |
| 2009/0289356 A1 | 11/2009 | Camacho et al. |
| 2009/0302435 A1 | 12/2009 | Pagaila et al. |
| 2009/0309235 A1 | 12/2009 | Suthiwongsunthom et al. |
| 2010/0006994 A1 | 1/2010 | Shim et al. |
| 2010/0193949 A1 | 8/2010 | Belanger et al. |
| 2010/0207265 A1 | 8/2010 | Muthukumar et al. |
| 2010/0244240 A1 | 9/2010 | Kapusta et al. |
| 2011/0198762 A1 | 8/2011 | Scanlan |
| 2011/0221054 A1 | 9/2011 | Lin et al. |
| 2012/0028411 A1* | 2/2012 | Yu .................. H01L 21/561 438/107 |
| 2012/0043654 A1 | 2/2012 | Lu et al. |
| 2012/0043655 A1 | 2/2012 | Khor et al. |
| 2012/0103475 A1 | 5/2012 | Kim |
| 2012/0112340 A1* | 5/2012 | Lin .................. H01L 24/19 257/734 |
| 2012/0119378 A1 | 5/2012 | Ng et al. |
| 2012/0139097 A1 | 6/2012 | Jin et al. |
| 2012/0217643 A1 | 8/2012 | Pagaila et al. |
| 2012/0306038 A1 | 12/2012 | Chow et al. |
| 2013/0043598 A1 | 2/2013 | Chen et al. |
| 2013/0062760 A1 | 3/2013 | Hung et al. |
| 2013/0075924 A1 | 3/2013 | Lin et al. |
| 2014/0070403 A1 | 3/2014 | Pan et al. |
| 2014/0264853 A1 | 9/2014 | Lin et al. |
| 2016/0307872 A1 | 10/2016 | Chen et al. |
| 2017/0098629 A1 | 4/2017 | Liu et al. |

FOREIGN PATENT DOCUMENTS

| | | |
|---|---|---|
| CN | 102468189 A | 5/2012 |
| CN | 102754196 A | 10/2012 |
| JP | 2001521288 A | 11/2001 |

(56) References Cited

FOREIGN PATENT DOCUMENTS

| KR | 20100047540 A | 5/2010 |
|---|---|---|
| KR | 20110077213 A | 7/2011 |

OTHER PUBLICATIONS

DfR Solutions, "your partner throughout the product life cycle", http://sites.ieee.org/ocs-cpmt/files/2013/06/Solder-Bump-vs.-Copper-Pillar_ver3.pdf, pp. 1-51.

* cited by examiner

FAN-OUT INTERCONNECT STRUCTURE AND METHOD FOR FORMING SAME

PRIORITY CLAIM AND CROSS-REFERENCE

This application is continuation of U.S. application Ser. No. 15/177,119 filed on Jun. 8, 2016, entitled "Fan-Out Interconnect Structure and Method for Forming Same," which is a divisional of U.S. application Ser. No. 13/937,726, filed on Jul. 9, 2013 (now U.S. Pat. No. 9,368,460, issued Jun. 14, 2016), entitled "Fan-Out Interconnect Structure and Method for Forming Same," which claims the benefit of U.S. Provisional Application No. 61/793,930, filed on Mar. 15, 2013, entitled "Cost-Reducing Fan-Out Interconnect Structure," which applications are hereby incorporated herein by reference in their entireties.

BACKGROUND

A typical integrated circuit structure is made up of dies that include active devices such as transistors and capacitors. These devices are initially isolated from each other, and interconnect structures are later formed over the active devices to create functional circuits. On top of the interconnect structures, metal pads are formed and exposed on the surface of the respective die. Electrical connections are made through the metal pads to connect the die to a package substrate or another die.

In an aspect of conventional packaging technologies, such as fan-out packaging, redistribution layers (RDLs) may be formed over a die and electrically connected to the metal pads. Input/output (I/O) pads such as solder balls may then be formed to electrically connect to the metal pads through the RDLs. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Various embodiments will be described with respect to a specific context, namely a fan-out packaging technology such as fan-out wafer level packaging (FO-WLP).

Figure 1:
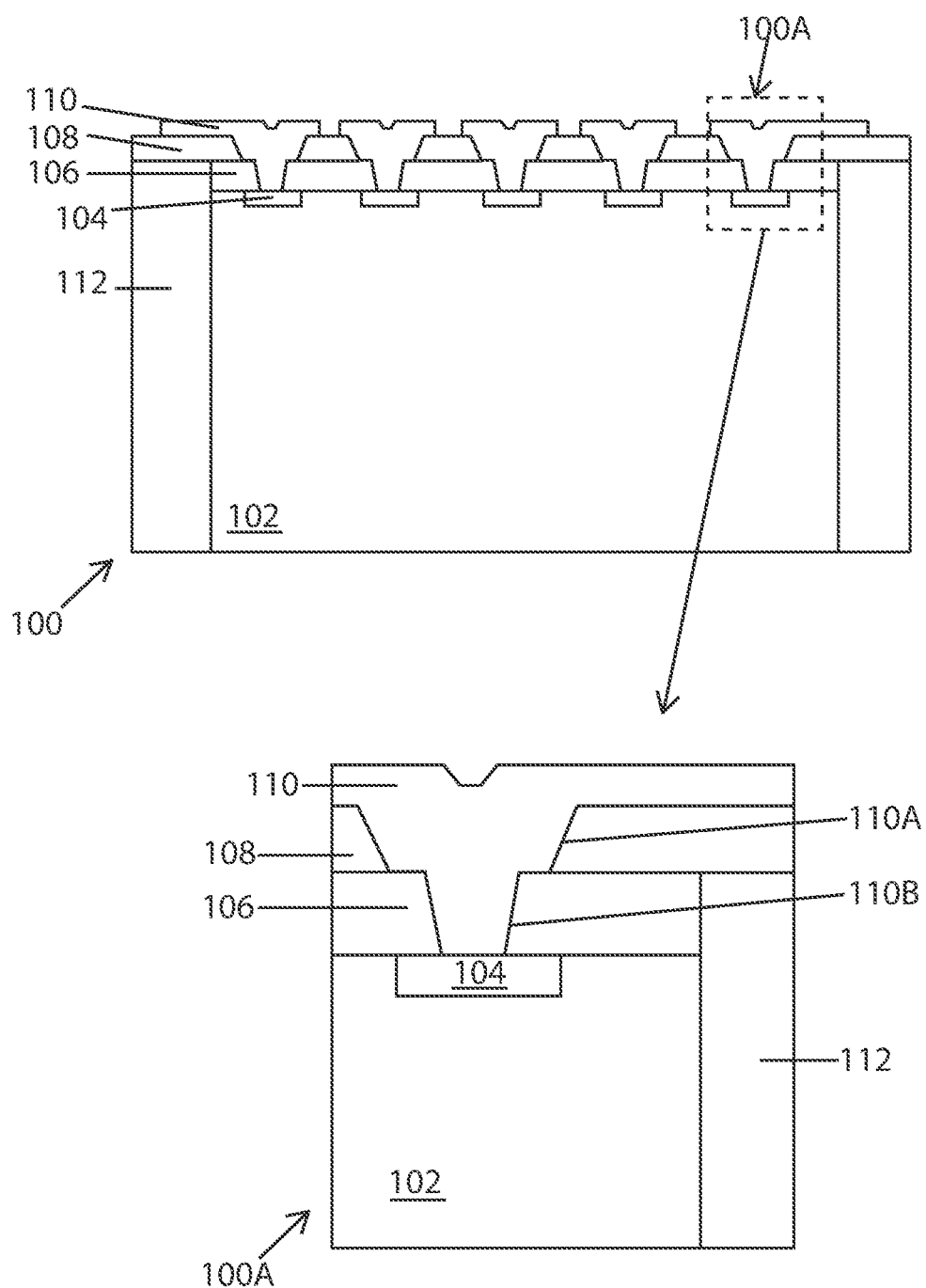
FIG. 1 is a cross-sectional view of an integrated circuit structure in accordance with various embodiments.

FIG. 1 is a cross-sectional view of a portion of an integrated circuit (IC) structure 100 in accordance with various embodiments. IC structure 100 includes a die 102 and a RDL 110 over die 102. Lateral portions of RDL 110 may extend beyond edges of die 102 and over molding compound 112. Therefore, the resulting IC structure 100 may be referred to as a fan-out package. Die 102 includes contact pads 104, a substrate 102S, and an interconnect structure 102I. RDL 110 is connected to devices (not shown) in die 102 through contact pads 104.

For the purpose of illustration, a portion of IC 100 has been magnified (100A) and is also shown in FIG. 1. Polymer layers 106 and 108 are formed over die 102. RDL 110 extends through both polymer layers 106 and 108 to contact contact pads 104. Notably, RDL 110 is directly connected to die 102 through contact pads 104, and IC structure 100 does not include an additional metallic pillar between RDL 110 and contact pads 104. RDL 110 may have sidewalls 110A and 110B. Sidewalls 110A and 110B may be sloped, and in some embodiments, sidewalls 110A and 110B may have a slope of about 30 to about 88.5 degrees. The appropriate angle for 110A and 110B may depend on layout design of RDLs 110. For example, selecting an angle closer to 88.5 degrees for sidewalls 110A and 110B allows for a fine pitch design and allow for a greater number of interconnect structures in polymer layer 106 and 108. By eliminating the need for a metallic pillar between RDL 110 and contact pads 104, the manufacturing cost of IC 100 may be reduced.

Figure 2A:
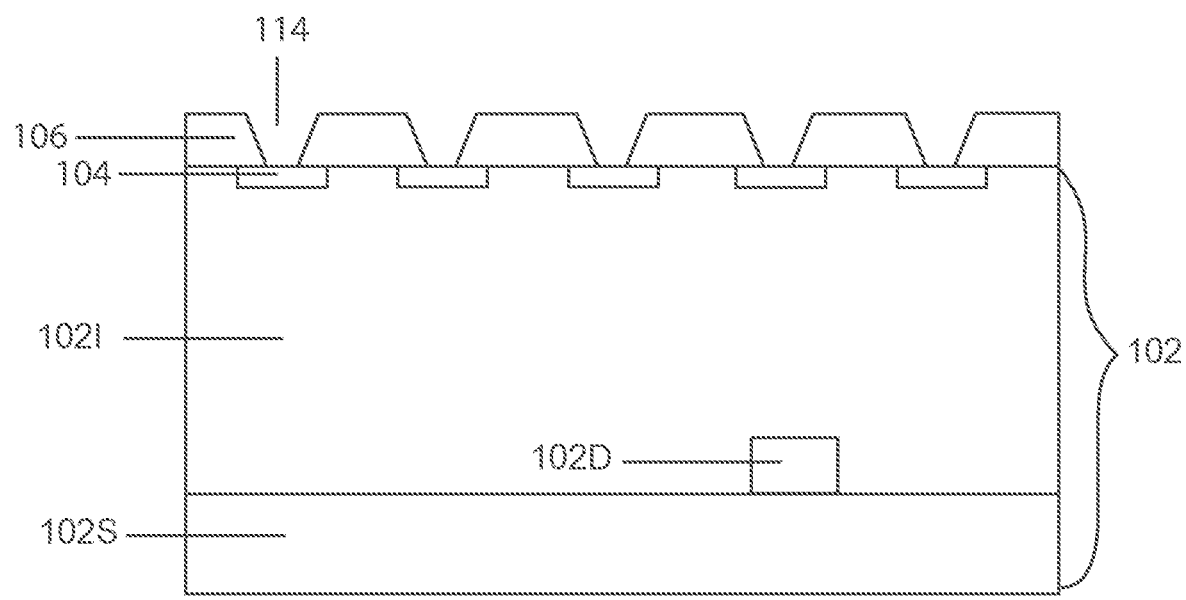
FIGS. 2A-2I are cross-sectional views of intermediate stages of manufacture of an integrated circuit structure in accordance with various embodiments.

FIGS. 2A-2I are cross-sectional views of intermediate stages of manufacture of IC structures (e.g., IC structure 100) in accordance with various embodiments. FIG. 2A illustrates a cross-sectional view of die 102, which may include a substrate 102S, active devices 102D, and an interconnect structure 102. The substrate 102S may be a bulk silicon substrate although other semiconductor materials including group III, group IV, and group V elements may also be used. Active devices 102D such as transistors may be formed on the top surface of the substrate 102S. An interconnect structure 102I may be formed over the active devices 102D and the substrate 102S. In subsequent drawings, the substrate 102S, active devices 102D, and the interconnect structure 102I are not explicitly illustrated for the sake of clarity.

The interconnect structure 102I may include an inter-layer dielectric (ILD) formed over the substrate 102S, and various inter-metal dielectric layers (IMDs) formed over the ILD. The ILD and IMDs may be formed of low-k dielectric materials having k values, for example, lower than about 4.0. The ILD and IMDs may be made of, for example, silicon oxide, SiCOH, and the like.

Contact pads 104 are formed over the interconnect structure 102I and may be electrically coupled to the active devices 102D through various metallic lines and vias in the interconnect structure 102. Contact pads 104 may be made of a metallic material and may also be referred to as metal pads. Contact pads 104 may be aluminum pads, although other metallic materials may also be used. Furthermore, a passivation layer (not shown) may be formed over the interconnect structure 102I and contact pads 104 and may be formed of non-organic materials such as silicon oxide, un-doped silicate glass, silicon oxynitride, and the like.

Contact pads 104 may have a lateral width of about 10 to about 100 μm. Openings may be formed in portions of the passivation layer that cover contact pads 104, exposing portions of contact pads 104. Portions of the passivation layer may also cover edge portions of contact pads 104. The various features of die 102 may be formed by any suitable method and are not described in further detail herein. Although FIG. 2A shows a single die 102, various embodiments may also be applied to a wafer having multiple dies. In subsequent drawings, the substrate 102S, active devices 102D, and the interconnect structure 102I are not explicitly illustrated for the sake of clarity.

Figure 5A:
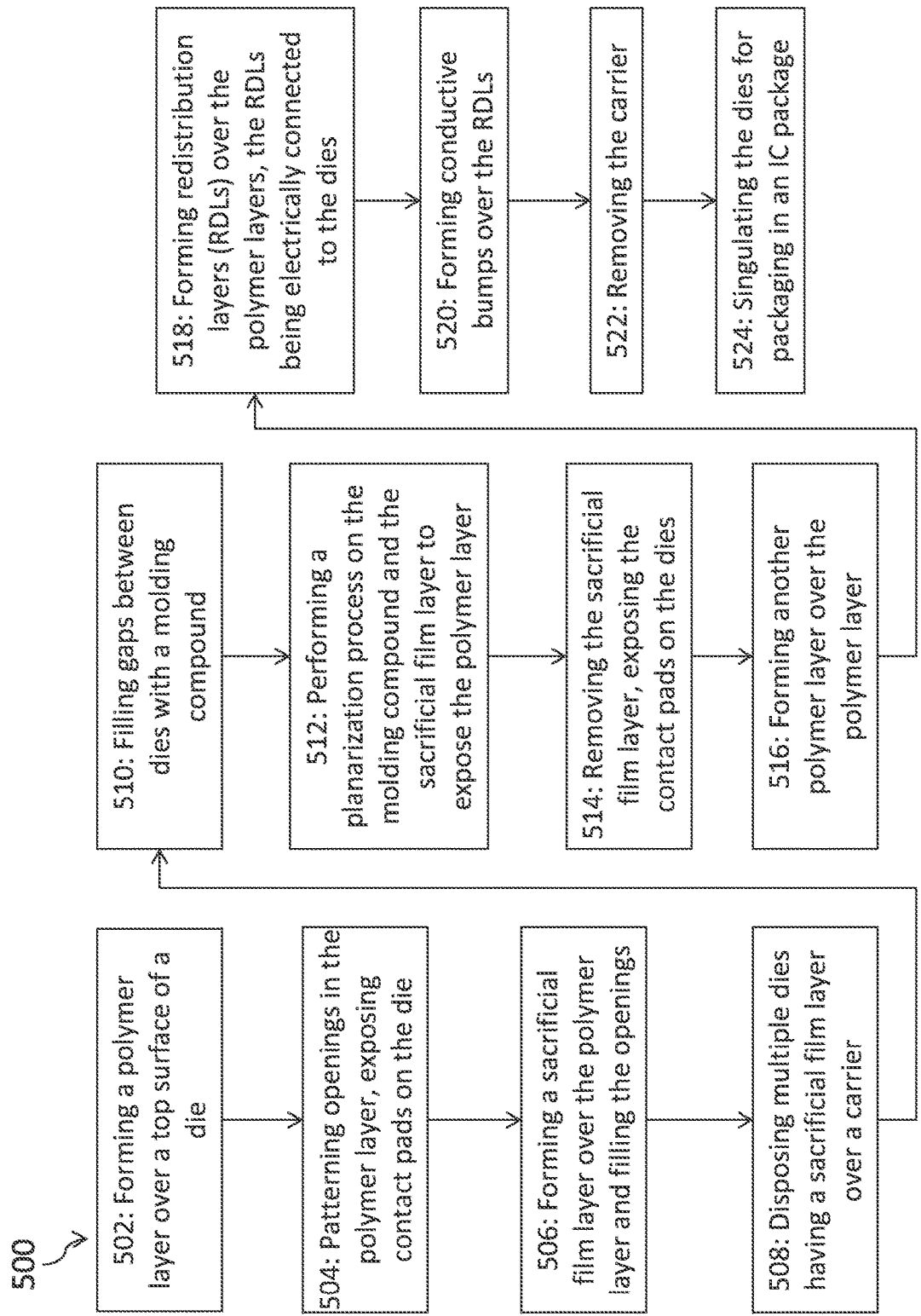
FIGS. 5A and 5B illustrate process flows for forming integrated circuit structures in accordance with various embodiments.

FIG. 2A also illustrates the formation of polymer layer 106 over a top surface of die 102 (see step 502 of process 500 in FIG. 5A). Polymer layer 106 may be formed of a material such as polyimide (PI), polybenzoxazole (PBO), benzocyclobuten (BCB), epoxy, silicone, acrylates, nano-filled pheno resin, siloxane, fluorinated polymer, polynorbornene, and the like. Polymer layer 106 may be formed using, for example, spin on coating techniques. Polymer layer 106 may have a thickness of less than about 20 μm. Polymer layer 106 is patterned using, for example, a combination of photolithographic techniques and etching (see step 504 of process 500 in FIG. 5A). The patterning of polymer layer 106 creates openings 114 exposing portions of contact pads 104.

Figure 2B:
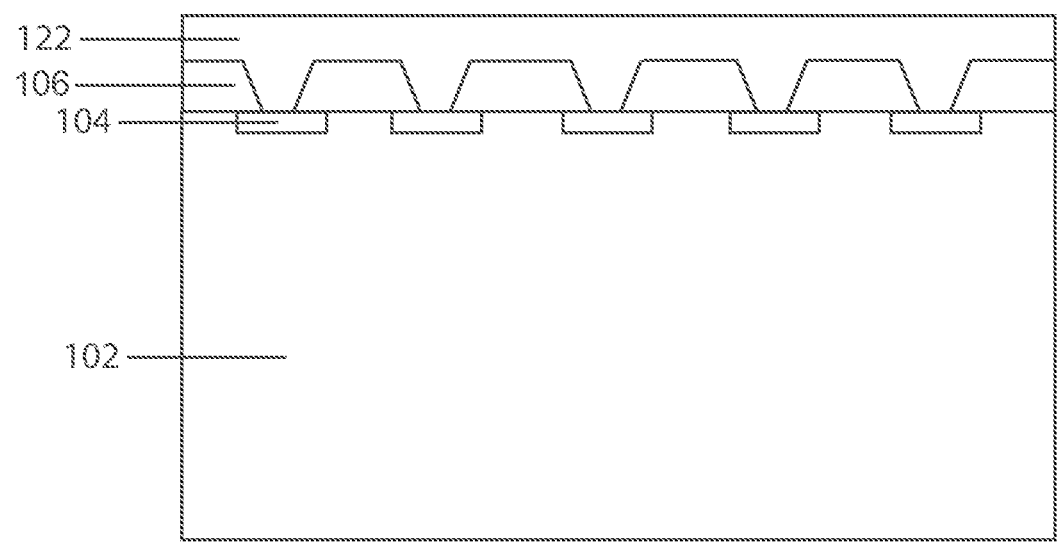

FIG. 2B illustrates the formation of a sacrificial film layer 122 over polymer layer 106 and filling openings 114 (see FIG. 2A, see also step 506 of process 500 in FIG. 5A). Sacrificial film layer 122 may be formed of a dielectric material such as a polymer, a polymer based photoresist, or a polyimide based photoresist. Sacrificial film layer 122 may be deposited using an appropriate technique such as spin-on coating, or the like. Furthermore, after sacrificial film layer 122 is deposited, it may be cured at an appropriate temperature. Alternatively, sacrificial film layer 122 may be a laminated film. For example, sacrificial film layer 122 may be a base film attached to dies 102 using an adhesive layer. The base film may be, for example, a polyethylene terephthalate (PET) base film, and the adhesive layer may be, for example, an ultraviolet (UV) or thermal activated release film.

Figure 2C:
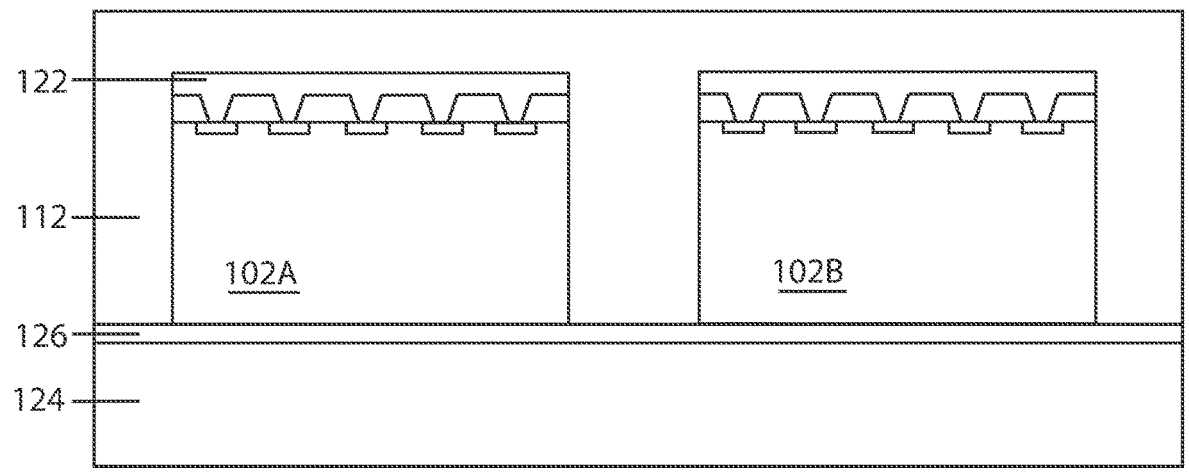

In FIG. 2C, multiple dies 102 (e.g., die 102A and die 102B) having sacrificial film layers 122 may be disposed over a carrier 124 (see step 508 of process 500 in FIG. 5A). Carrier 124 may be made of a suitable material, for example, glass. Bottom surfaces of dies 102A and 102B may be affixed to carrier 124 using an adhesive layer 126 as an interface. Adhesive layer 126 may be formed of a temporary adhesive material such as ultraviolet (UV) tape, wax, glue, or the like. Furthermore, a die attach film (DAF) may optionally be formed under dies 102 (not shown) prior to their placement on carrier 124. The DAF allows for improved adhesion between dies 102 and carrier 124.

Molding compound 112 may be used fill gaps between dies 102 (e.g., dies 102A and 102B; see step 510 of process 500 in FIG. 5A). Molding compound 112 may be any suitable material such as an epoxy resin, a molding underfill, or the like. Suitable methods for forming molding compound 112 may include compressive molding, transfer molding, liquid encapsulant molding, or the like. For example, molding compound 112 which may be dispensed between dies 102A and 102B in liquid form. Subsequently, a curing process is performed to solidify molding compound 112. The filling of molding compound 112 may overflow over dies 102 so that molding compound 112 covers a top surface of dies 102A and 102B.

Figure 2D:
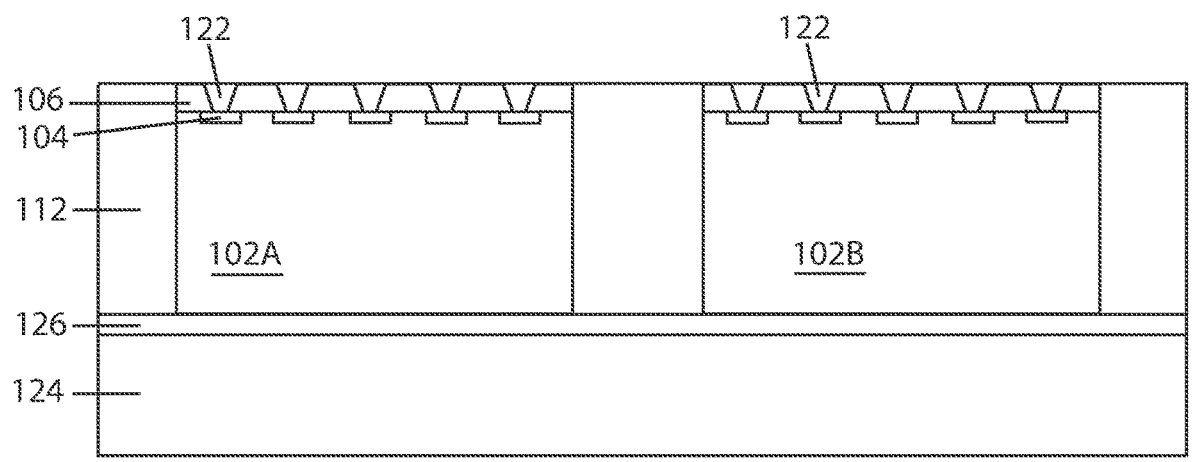

In FIG. 2D, a planarization process, such as a grinding process (e.g., a chemical-mechanical polish (CMP) or mechanical grinding) may be performed on molding compound 112 and sacrificial film layer 122 to expose polymer layer 106 (see step 512 of process 500 in FIG. 5A). As part of grinding process, upper portions of polymer layer 106 may also be removed to achieve a desired thickness. After the grinding process, polymer layer 106 may have a thickness of, for example, about 5 μm to about 15 μm. Polymer layer 106 and remaining portions of sacrificial film layer 122 act as a shield for contact pads 104 and dies 102 during the grinding process in lieu of a metallic pillar, reducing manufacturing costs.

Figure 2E:
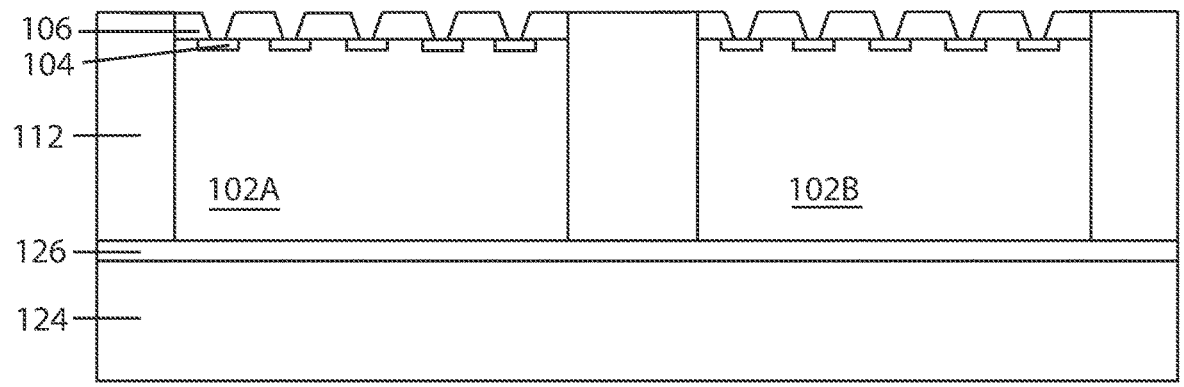

In FIG. 2E, sacrificial film layer 122 is removed from dies 102A and 102B, exposing contact pads 104 through polymer layer 106 (see step 514 of process 500 in FIG. 5A). The removal of sacrificial film layer 122 may include an etching process (e.g., a wet etch) that selectively removes the material of sacrificial film layer without significantly removing the materials of polymer layer 106 or dies 102A and 102B. This may be done by selecting an appropriate stripping chemical for the etching such as an alkaline based chemical. In an embodiment in which polymer layer 106 is formed of PBO and sacrificial film layer 122 is formed of a polymer/polyimide based photoresist, sacrificial film layer 122 may be removed using potassium hydroxide (KOH)), n-methylpyrrolidone (NMP), or the like as a stripping chemical.

Figure 2F:
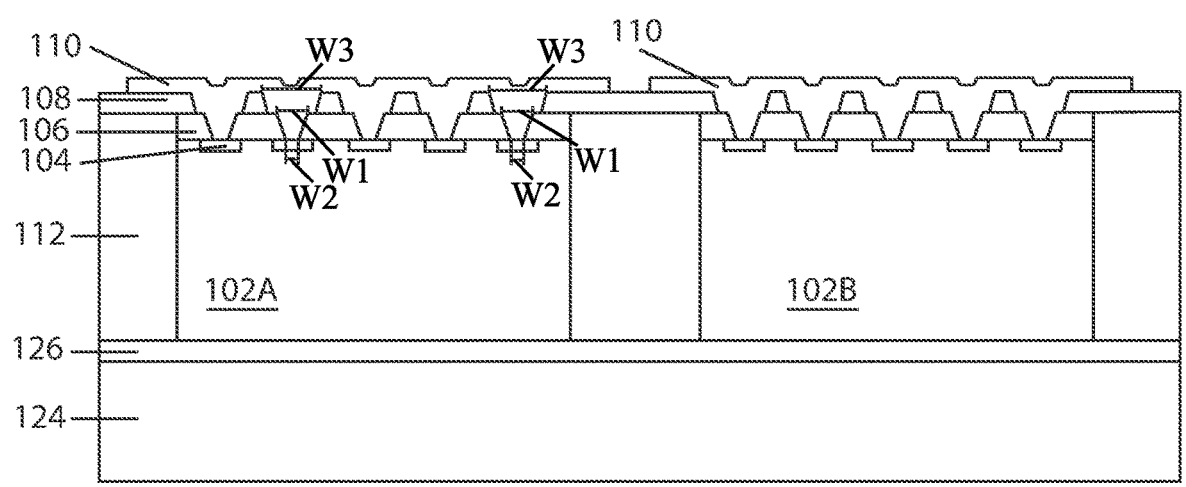

In FIG. 2F, a second polymer layer 108 is formed over polymer layer 106 (see step 516 of process 500 in FIG. 5A). Polymer layer 108 may be substantially similar to polymer layer 106, and polymer layer 108 may have a thickness over polymer layer 106 of less than about 20 μm. Furthermore, the formation of polymer layer 108 may fill openings in polymer layer 106 (i.e., openings 114). Afterwards, polymer layers 108 and 106 may be subsequently patterned or re-patterned (e.g., through photolithography and etching) to expose contact pads 104 through a plurality of openings (not shown). The patterning of polymer layers 106 and 108 may be done using the same photolithography and etching process. However, the portions of openings in polymer layer 108 may be wider than portions of openings in polymer layer 106. This may be achieved, for example, by controlling various conditions (e.g., depth of focus, exposure energy, or the like) of the photolithography and etching process.

RDLs 110 are formed over dies 102A and 102B, respectively. RDLs 110 may be electrically connected to the various devices in dies 102A and 102B through contact pads 104 (see step 518 of process 500 in FIG. 5A). RDLs 110 may be formed of copper or a copper alloy although other metals such as aluminum, gold, or the like may also be used. RDLs 110 may be formed in the same process step using any suitable method. For example, the formation of RDLs 110 may involve a seed layer and using a mask layer to define the shape of RDLs 110. A via portion of RDLs 110 in polymer layer 106 may have a lateral width W1 at the top surface of polymer layer 106 of between about 10 μm to about 110 μm depending on the lateral width W2 of the portion of the via contacting a contact pad 104. That is, a via portion of RDLs 110 at the top surface of polymer layer 106 may be slightly wider in the lateral dimension than width W2. Similarly, a portion of RDLs 110 in polymer layer 108 may have a lateral width (denoted by W3) of between about 12 m to about 120 μm depending on W1 and W2. That is, the portion of RDLs 110 in polymer layer 108 may be slightly wider in the lateral dimension than widths W1 and W2. Therefore, the contact surface area of contact pad 104 may be redistributed to a wider surface area using RDLs 110.

Notably, RDLs 110 are connected to contact pads 104 without the use of an additional metallic pillar or via between RDL 110 and contact pads 104. Although only one RDL 110 is shown over each die 102, in alternative embodiments, multiple RDLs may be formed over and be interconnected to RDL 110.

Figure 2G:
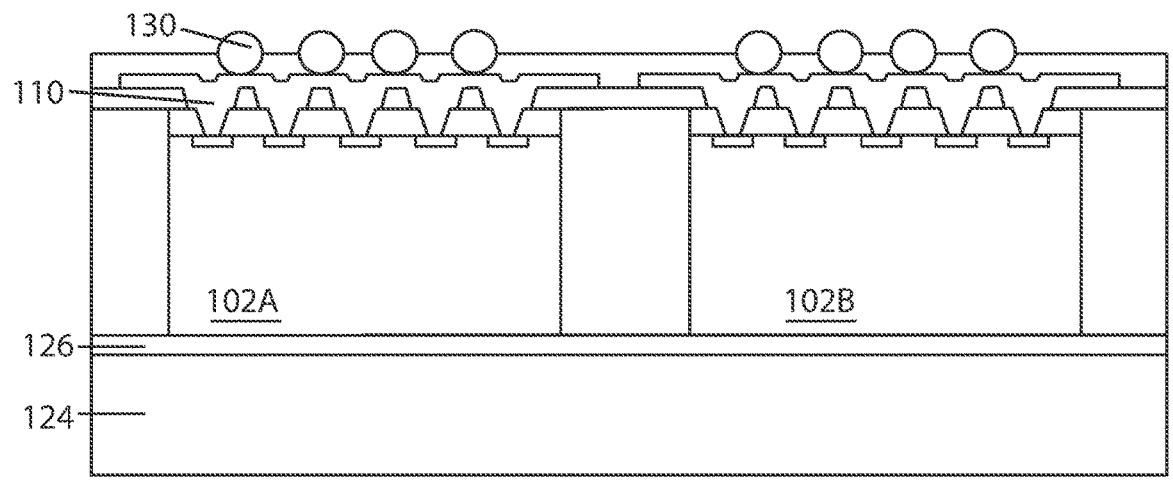

FIG. 2G illustrates the formation of conductive bumps 130 over RDLs 110 (see step 520 of process 500 in FIG. 5A). Conductive bumps 130 may be formed over under bump metallurgies (UBMs) (not shown) electrically connected to portions of RDLs 110. The UBMs may be formed of conductive materials such as copper, copper alloys, titanium, titanium alloys, or the like. Conductive bumps 130 may be reflowable bumps such as solder balls, which may include Sn—Ag, Sn—Cu, Sn—Ag—Cu, or the like. Alternatively conductive bumps 130 may be non-reflowable bumps such as copper bumps, and the like. Conductive bumps 130 are formed to electrically connect and bond other package components such as a wafer, a device die, an interposer, a printed circuit board (PCB), and the like to dies 102.

Figure 2H:
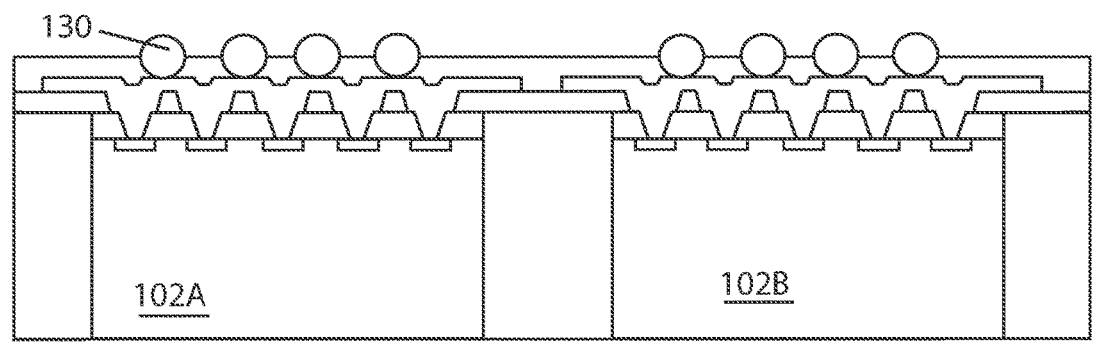
Figure 2I:
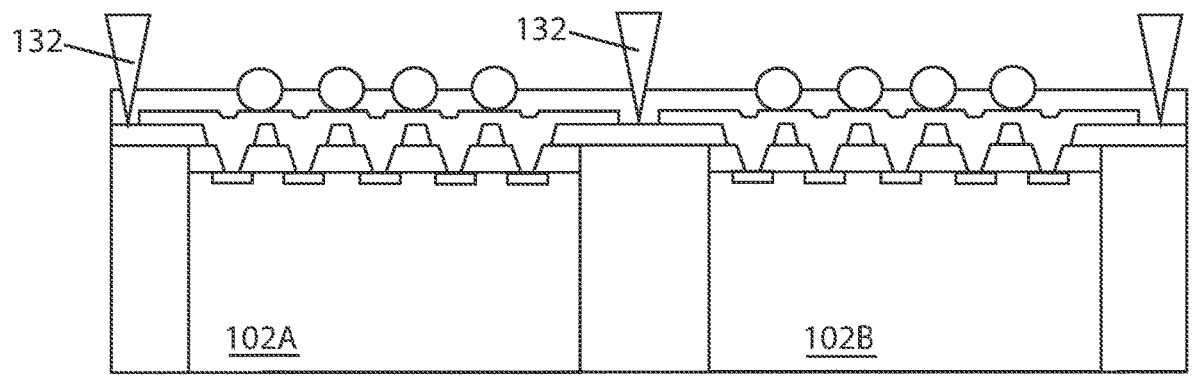

In FIG. 2H, carrier 124 and adhesive layer 126 are removed from dies 102A and 102B (see step S22 of process 500 in FIG. 5A). In an embodiment in which adhesive layer 126 is formed of UV tape, dies 102A and 102B may be removed by exposing adhesive layer 126 to UV light. In FIG. 2I, dies 102A and 102B may be singulated for packaging an IC package (see step 524 of process 500 in FIG. 5A). The singulation of dies 102A and 102 may include the use of a suitable pick-and-place tool such as pick-and-place tool 132. In a top down view (not shown) of dies 102 molding compound 112 may contact the sidewalls of and encircle die 102.

Figure 3A:
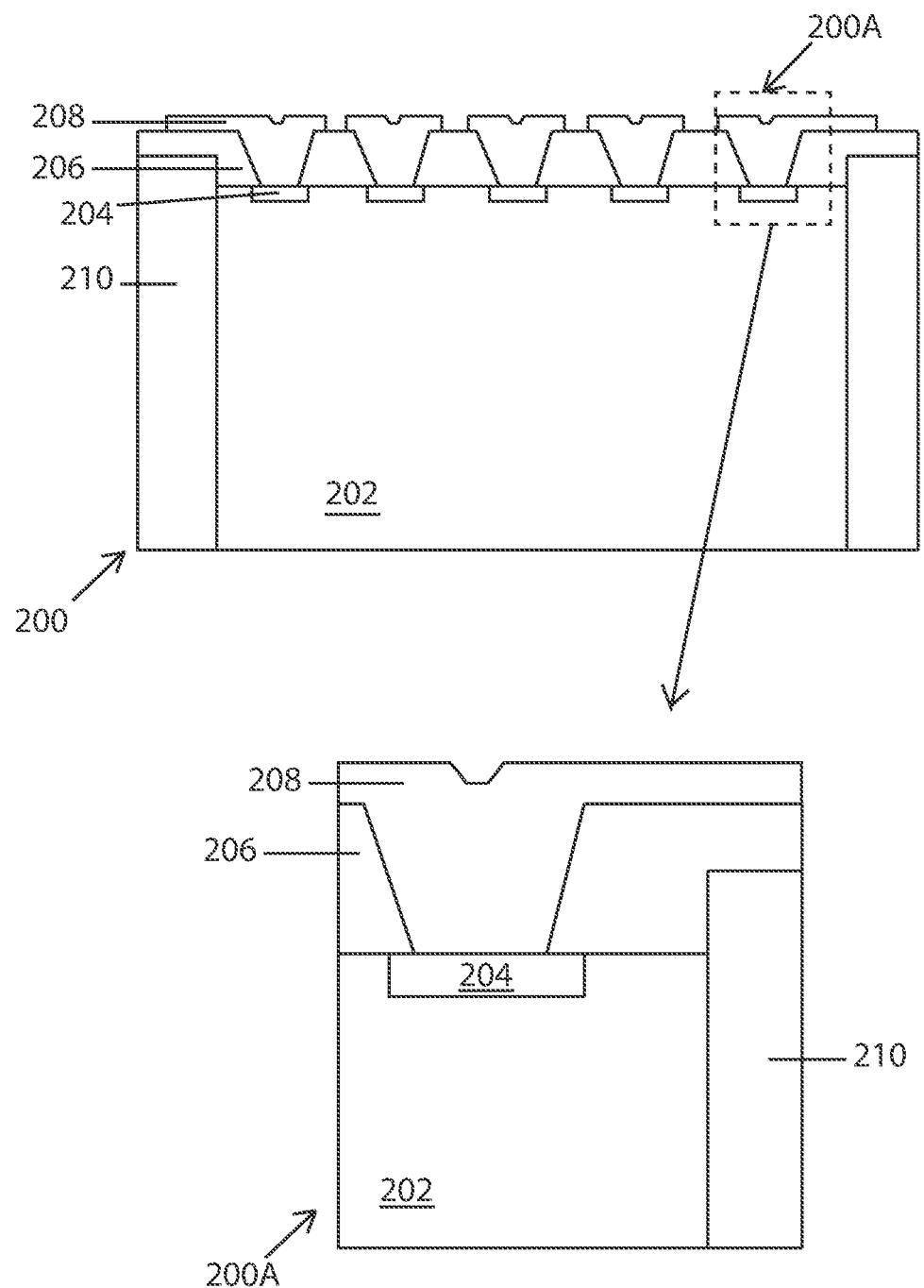
FIGS. 3A and 3B are cross-sectional views of an integrated circuit structure in accordance with various alternative embodiments.
Figure 3B:
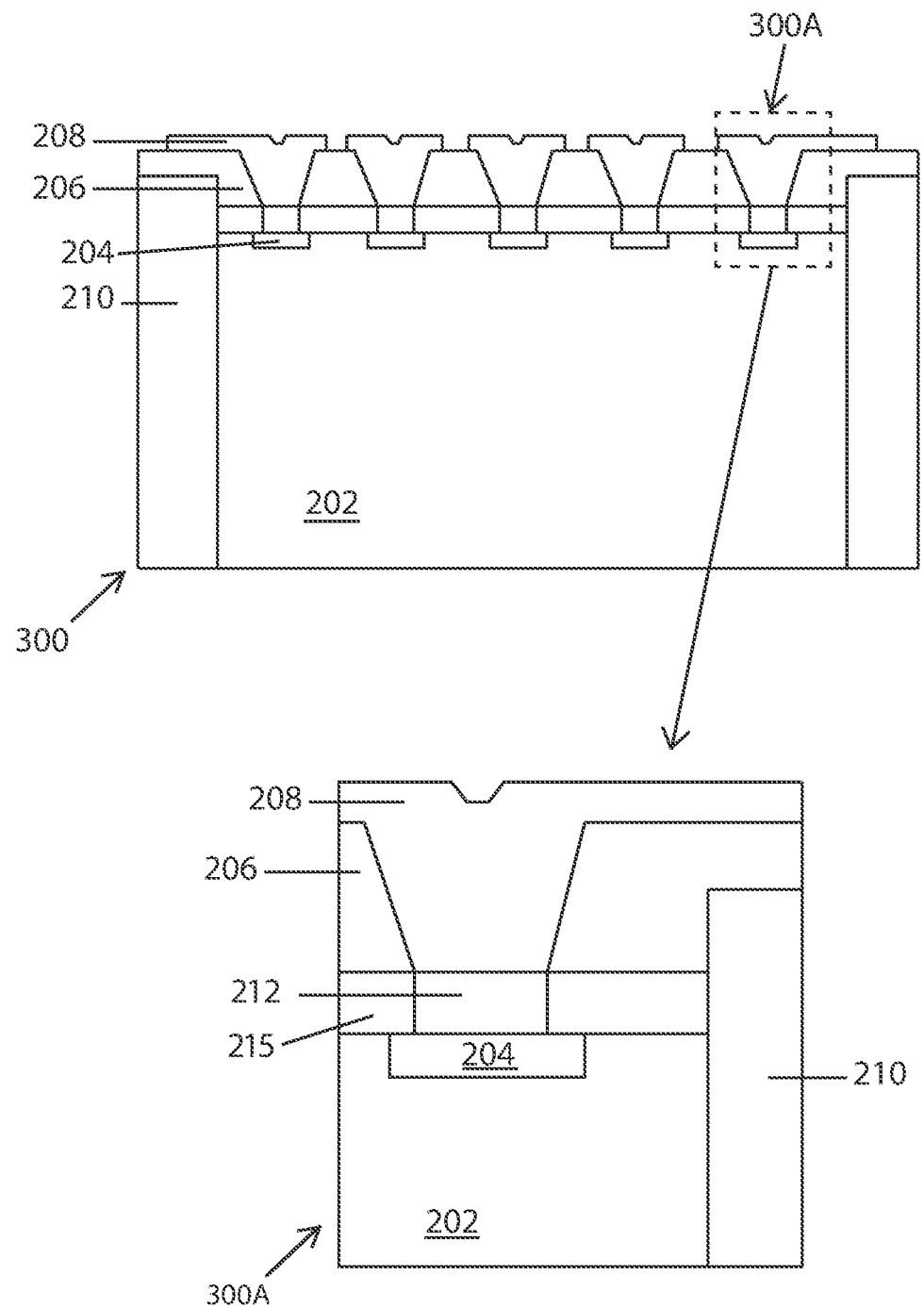

FIGS. 3A and 3B illustrate cross-sectional views of IC structures 200 (FIG. 3A) and 300 (FIG. 3B) in accordance with alternative embodiments. IC structures 200 and 300 include a die 202 having contact pads 204 and a RDL 208 over die 202 connected to contact pads 204. Lateral portions of RDL 208 may extend beyond die 202 and over molding compound 210 to form a fan-out packaging. Die 202 may (as shown in FIG. 3B) or may out (as shown in FIG. 3A) include a polymer layer 215 having a metallic pillar 212 over and connected to contact pads 204. Metallic pillar 212 may be a copper pillar, although other metals such as aluminum, gold, or the like may also be used. Polymer layer 215 may be substantially similar to polymer layers 106 and 108 (see FIG. 1).

For the purpose of illustration, a portion of IC 200 and 300 have been magnified (200A and 300A, respectively) and is also shown in FIGS. 3A and 3B. A polymer layer 206 includes a first portion over molding compound 210 and a second portion extending past a top surface of molding compound 210. RDL 208 may extend through polymer layer 206 and be electrically connected to contact pads 204. RDL 208 may be directly connected to contact pads 204 (shown in FIG. 3A) or be connected to contact pads 204 through metallic pillars 212 in a polymer layer 215 (shown in FIG. 3B). Notably, the top surface of die 202 is recessed from a top surface of molding compound. Furthermore, an edge of molding compound 210 over die 202 may be substantially perpendicular and may have an angle of between about 85° to 95°. This recessed and perpendicular interface allows for improved adhesion between polymer layer 206 and die 202.

Figure 4A:
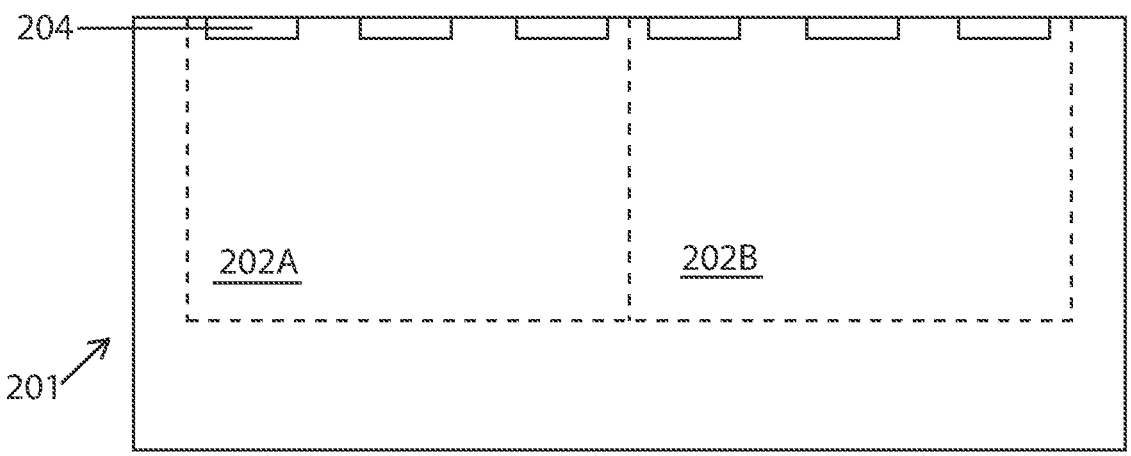
FIGS. 4A-4H are cross-sectional views of intermediate stages of manufacture of an integrated circuit structure in accordance with various alternative embodiments.

FIGS. 4A-4H illustrate cross-sectional views of intermediate stages of manufacture of an IC structure in accordance with various alternative embodiments. In FIG. 4A, various dies 202 (labeled as 202A and 202B) are provided in a wafer 201 (see step 602 of process 600 in FIG. 5B). Dies 202 include contact pads 204, which may formed of a metallic material (thus, contact pads 204 may also be referred to as metal pads 204) and be used to connect to various devices (not shown) in dies 202. Dies 202 may be substantially similar to dies 102 in FIGS. 1 and 2A-2I. Alternatively, dies 202 may also include a top polymer layer having metallic pillars (not shown) connected to contact pads 204. Although FIG. 4A shows a wafer 201, various embodiments may also be applied to single dies.

Figure 4B:
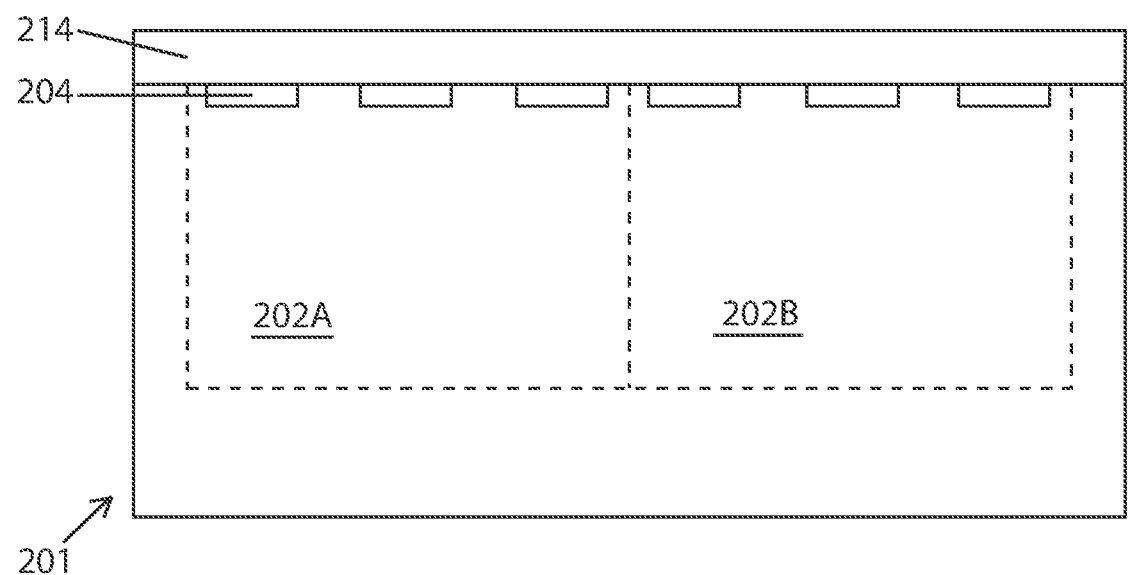
Figure 5B:
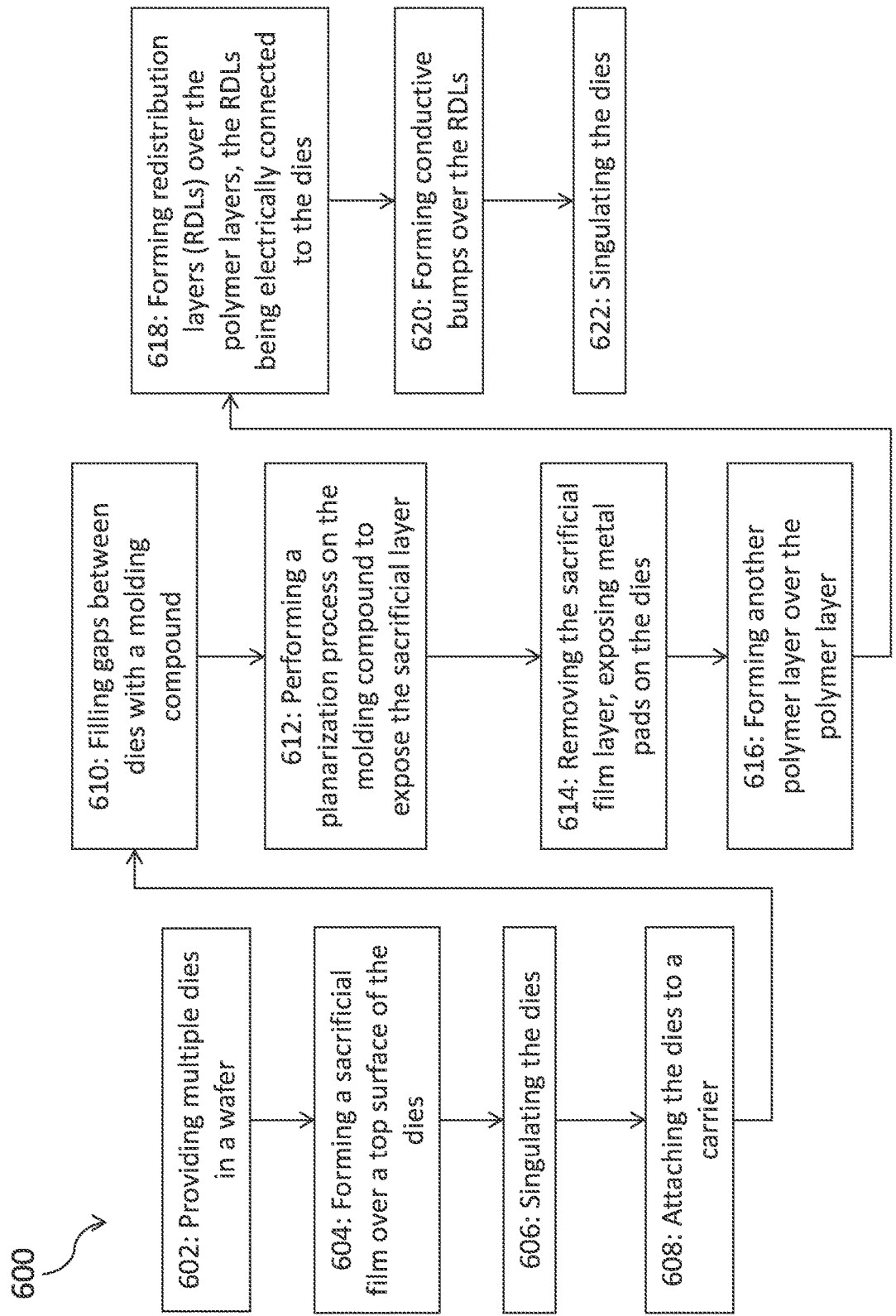

In FIG. 4B, a sacrificial film layer 214 is formed over a top surface of dies 202 (see step 604 of process 600 in FIG. 5B). Sacrificial film layer 214 may be substantially similar to sacrificial film layer 122. That is, sacrificial film layer 214 may be a polymer or polyimide based photoresist formed using, for example, spin-on coating techniques. Alternatively, sacrificial film layer 214 may be a laminated film such as a PET base film attached to dies 202 using an adhesive layer (e.g., UV or thermal activated release film).

Figure 4C:
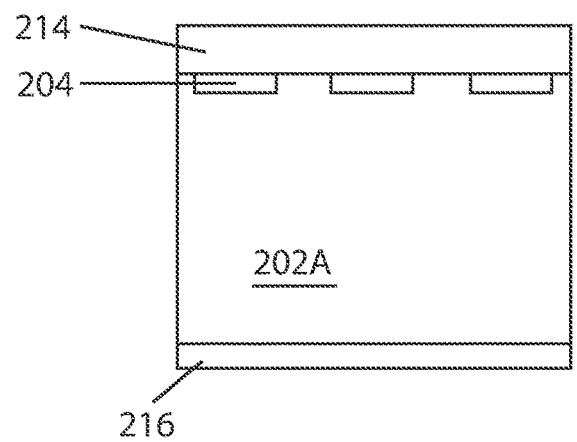

In FIG. 4C, dies 202 may be singulated (see step 606 of process 600 in FIG. 5B). For example, FIG. 4C illustrates die 202A being separated from die 202B. Additionally, a die attach film (DAF) 216 may optionally be formed under bottom surfaces of dies 202.

Figure 4D:
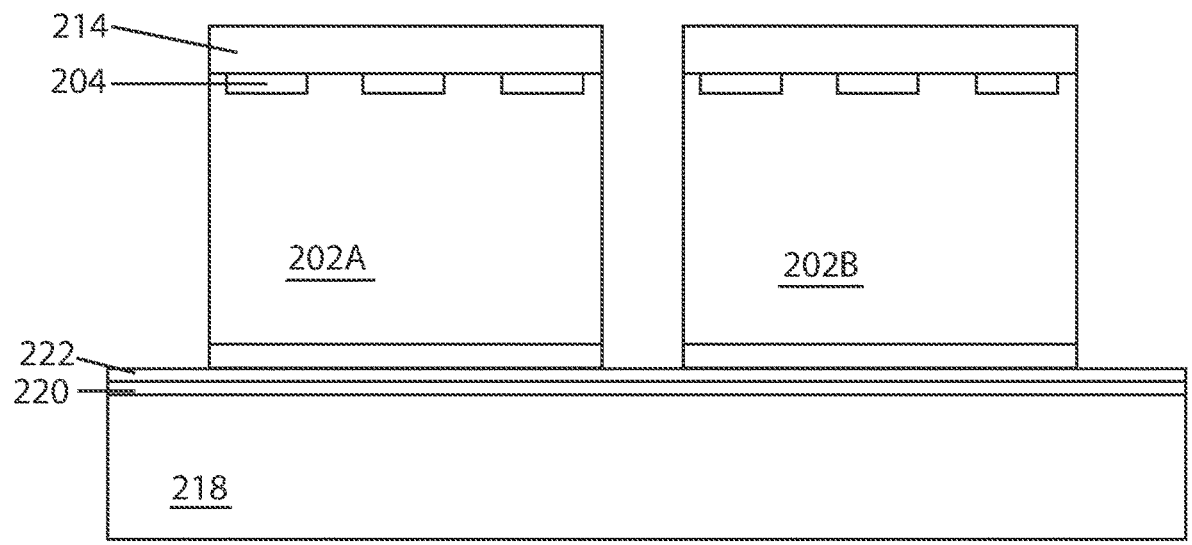

In FIG. 4D, bottom surfaces of dies 202A and 202B may be attached to a carrier 218 (see step 608 of process 600 in FIG. 5B) using an adhesive layer 220 (e.g., a light-to-heat-conversion release (LTHC) layer, a glue layer, or the like). Furthermore, a polymer layer 222 may be formed over carrier 218 so that dies 202 may be properly aligned with carrier 218.

Figure 4E:
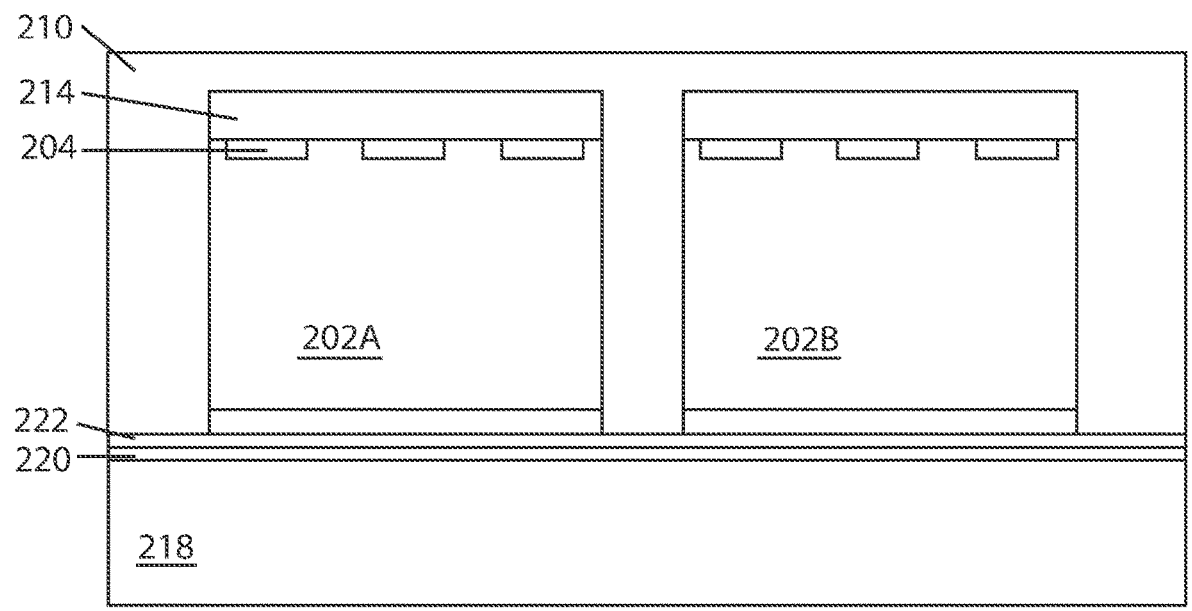

In FIG. 4E, a molding compound 210 may be used fill gaps between dies 202 (see step 610 of process 600 in FIG. 5B). Molding compound 210 may be any suitable material such as an epoxy resin, a molding underfill, or the like. Suitable methods for forming molding compound 210 may include compressive molding, transfer molding, liquid encapsulant molding, or the like. For example, molding compound 210 which may be dispensed between dies 202 in liquid form. Subsequently, a curing process is performed to solidify molding compound 210. The filling of molding compound 210 may overflow dies 202 so that molding compound 210 covers a top surface of dies 202.

Figure 4F:
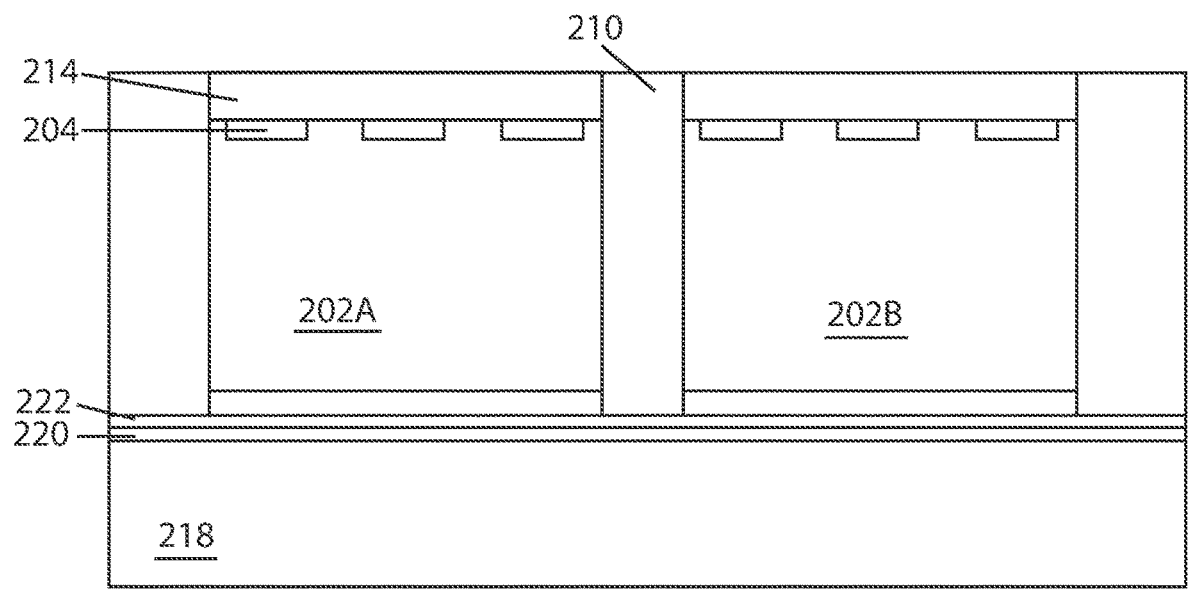

In FIG. 4F, a grinding process (e.g., a CMP or etch-back technique) may be employed to remove excess portions of molding compound 210 so that its top surface is level with top surfaces of sacrificial film layer 213 (see step 612 of process 600 in FIG. 5B). The grinding may also remove portions of sacrificial film layer 214 to a desired thickness. Sacrificial film layer 214 acts as a protection layer for dies 202 during the grinding of molding compound 210.

Figure 4G:
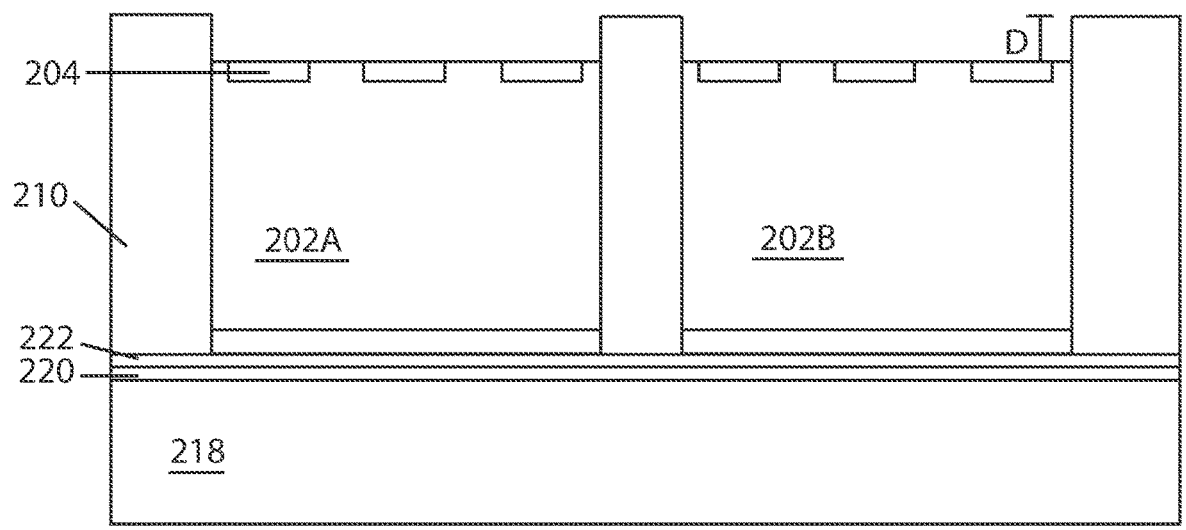

In FIG. 4G, sacrificial film layer 214 is removed, exposing contact pads 204 (see step 614 of process 600 in FIG. 5B). The method of removing sacrificial film layer 214 may depend on its composition. For example, if sacrificial film layer 214 is a coated layer, such as a photoresist, then a wet etch technique may be used to selectively remove sacrificial film layer 214 by choosing an appropriate etch chemical (e.g., KOH). If sacrificial film layer 214 is a laminated layer, such as a base film over an adhesive layer, then sacrificial film layer 214 may be removed by releasing the adhesive layer. This may be achieved by for example, exposing the adhesive layer to an appropriate environment such as hot air, a hot plate, an infrared lamp, UV light, or the like.

As shown in FIG. 4G, a top surface of dies 202 are recessed from a top surface of molding compound 210 by a distance D. Distance D may be greater than about 0.1 µm or even greater than about 1 µm. The dimensions of distance D may depend on the composition of sacrificial film layer 214. For example, if sacrificial film layer 214 is a coated layer, distance D may be less than about 20 µm. In an alternative example, if sacrificial film layer 214 is a laminated layer, distance D may be less than about 120 µm. Furthermore, the shape of edges of molding compound 210 over dies 202 may be substantially perpendicular. That is, sidewalls of molding compound 210 adjacent to and over dies 202 may have a slope of about 85 to 95 degrees.

Figure 4H:
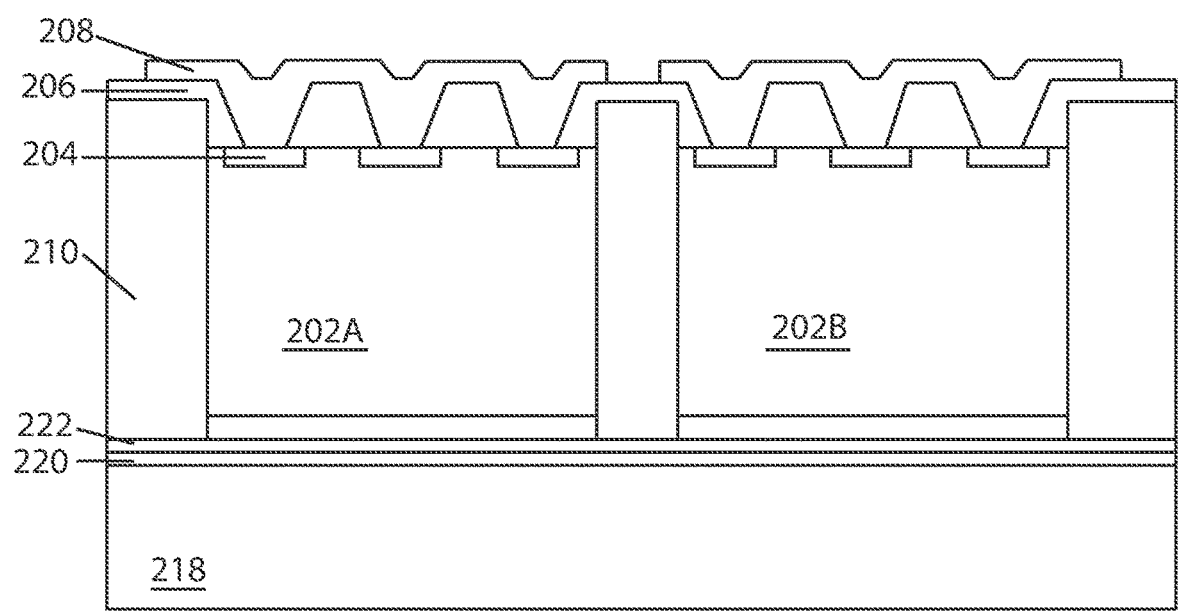

In FIG. 4H, a polymer layer 206 and RDLs 208 may be formed over molding compound 210 to electrically connect directly to contact pads 204 (see steps 616 and 618 of process 600 in FIG. 5B). Polymer layer 206 and RDLs 208 may be substantially similar to polymer layer 108 and RDL 110 respectively (see FIG. 2F). Although only one RDL 208 is shown over each die 202, in alternative embodiments, multiple RDLs may be formed over and be interconnected to RDL 208. Subsequently, conductive bumps, such as bond balls, (not shown) may be formed over RDL 208 (see step 620 of process 600 in FIG. 5B), and dies 202 may be singulated (see step 614 of process 600 in FIG. 5B).

In accordance with an embodiment, a method for integrated circuit packaging includes forming a sacrificial film layer over a top surface of a die, the die having a contact pad at the top surface. The die is attached to a carrier, and a molding compound is formed over the die and the sacrificial film layer. The molding compound extends along sidewalls of the die. The sacrificial film layer is exposed. The contact pad is exposed by removing at least a portion of the sacrificial film layer. A first polymer layer is formed over the die, and a redistribution layer (RDL) is formed over the die and electrically connects to the contact pad.

In accordance with another embodiment, an integrated circuit structure includes a die comprising a substrate, an interconnect structure over the substrate, and a contact pad over the interconnect structure. A molding compound surrounds sidewalls of the die. A top surface of the molding compound is higher than a top surface of the die. The IC structure further includes a redistribution layer (RDL) over the die. The RDL comprises a continuous via structure directly connected to the contact pad. The continuous via structure is formed of a conductive material.

In accordance with yet another embodiment, an integrated circuit (IC) structure includes a die comprising a contact pad and a molding compound surrounding sidewalls of the die. The die has a top surface lower than a top surface of the molding compound. The IC structure further includes a redistribution layer (RDL) over the die. The RDL comprises a via connected to the metal pad, and wherein the via has an upper portion higher than the molding compound and a lower portion extending lower than a top surface of the molding compound.

In accordance with yet another embodiment, an integrated circuit (IC) structure includes a die. The die includes a substrate, an interconnect structure over the substrate, and a contact pad over the interconnect structure. The IC structure further includes a molding compound surrounding sidewalls of the die. A top surface of the molding compound is higher than a top surface of the die. The IC structure further includes a first polymer layer over the die. A top surface of the first polymer layer is level with the top surface of the molding compound. The IC structure further includes a redistribution layer (RDL) over the die. The RDL comprises a continuous via structure directly connected to the contact pad. The continuous via structure comprises a conductive material. The continuous via structure has a first portion extending through the first polymer layer and a second portion extending along the top surface of the first polymer layer.

In accordance with yet another embodiment, an integrated circuit (IC) structure includes a die. The die has a first surface and a second surface opposite the first surface. The die has a contact pad at the first surface. The IC structure further includes a first polymer layer over the die. The first polymer layer physically contacts the first surface of the die. The IC structure further includes a molding compound extending along a sidewall of the die and a sidewall of the first polymer layer. A top surface of the first polymer layer is level with a top surface of the molding compound. The IC structure further includes a redistribution layer (RDL) over the die. The RDL comprises a via structure. A first portion of the via structure extends through the first polymer layer and physically contacts the contact pad. A second portion of the via structure physically contacts the top surface of the first polymer layer.

In accordance with yet another embodiment, an integrated circuit (IC) structure includes a die comprising a contact pad. The IC structure further includes a molding compound surrounding sidewalls of the die. The die has a top surface lower than a top surface of the molding compound. The IC structure further includes a redistribution layer (RDL) over the die. The RDL includes a via connected to the contact pad. The via has an upper portion higher than the top surface of the molding compound and a lower portion extending lower than the top surface of the molding compound. A sidewall of the upper portion, a bottom surface of the upper portion and a sidewall of the lower portion form a step.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
   providing a die comprising a contact pad at a top surface thereof;
   forming a first polymer layer over the die; etching the first polymer layer to form a first opening exposing the contact pad;
   depositing a sacrificial material in the first opening;
   forming a molding compound surrounding the first polymer layer and the die;
   removing the sacrificial material after forming the molding compound;
   forming a second polymer layer over the molding compound and the first polymer layer; and forming a second opening through the second polymer layer and the first polymer layer, the second opening exposing the contact pad; and forming a redistribution layer in the second opening, the redistribution layer extending along top surfaces of the contact pad, the first polymer layer, and the second polymer layer.

2. The method of claim 1, further comprising planarizing the molding compound, the sacrificial material, and the first polymer layer.

3. The method of claim 1, further comprising attaching the die to a carrier after forming the sacrificial material and before forming the molding compound.

4. The method of claim 1, wherein forming the second opening comprises patterning the first polymer layer and the second polymer layer using a same patterning process.

5. The method of claim 1, wherein the redistribution layer is formed as a single layer of conductive material, the single layer extending along a top surface of the contact pad, a top surface of the first polymer layer, and a top surface of the second polymer layer.

6. The method of claim 2, wherein the sacrificial material is removed after planarizing the molding compound, the sacrificial material, and the first polymer layer, before forming the second polymer layer.

7. A method comprising:

providing a die having a contact pad at a top surface;

forming a first polymer layer over the top surface of the die;

patterning the first polymer layer to form a first opening exposing the contact pad;

forming a sacrificial material over the first polymer layer, the sacrificial material filling the first opening;

forming a molding compound surrounding the die, the first polymer layer, and the sacrificial material;

planarizing the molding compound and the sacrificial material to expose the first polymer layer;

removing the sacrificial material;

forming a second polymer layer over the molding compound and the first polymer layer; and forming a redistribution layer (RDL) extending through the first polymer layer and the second polymer layer, the RDL being electrically connected to the contact pad.

8. The method of claim 7, further comprising:

simultaneously patterning the second polymer layer and the first polymer layer to form a second opening exposing the contact pad, wherein the RDL is formed in the second opening.

9. The method of claim 8, wherein the second opening exposes a horizontal top surface of the first polymer layer.

10. The method of claim 8, wherein the RDL is formed in physical contact with a top surface of the second polymer layer, a top surface of the first polymer layer, and a top surface of the contact pad.

11. The method of claim 7, wherein the sacrificial material is removed using an alkaline-based chemical as a strip chemical.

12. The method of claim 7, wherein the sacrificial material is removed using n-methylpyrrolidone (NMP) as a strip chemical.

13. The method of claim 7, wherein the RDL extends along a top surface of the first polymer layer and laterally over a top surface of the molding compound.

14. A method comprising:

providing a die having a contact pad at a top surface;

forming a first polymer layer over the die;

forming a sacrificial film layer over the die;

forming a molding compound surrounding the die and the sacrificial film layer;

planarizing the molding compound and the sacrificial film layer;

removing the sacrificial film layer;

forming a second polymer layer extending along a top surface of the die and a top surface of the molding compound, the top surface of the molding compound being disposed above the top surface of the die;

forming a first opening through the second polymer layer and the first polymer layer, the first opening exposing a surface of the contact pad; and forming a redistribution layer in the first opening.

15. The method of claim 14, further comprising attaching the die to a carrier after forming the sacrificial film layer.

16. The method of claim 14, wherein removing the sacrificial film layer comprises exposing the sacrificial film layer to a wet etch process.

17. The method of claim 16, wherein an etch chemical used in the wet etch process comprises potassium hydroxide (KOH).

18. The method of claim 14, further comprising forming a first polymer layer over the die, wherein the sacrificial film is formed in an opening extending through the first polymer layer, wherein planarizing the molding compound and the sacrificial film layer further comprises planarizing the first polymer layer.

19. The method of claim 14, wherein the molding compound is formed in contact with a top surface and sidewalls of the sacrificial film layer, sidewalls of the first polymer layer, and sidewalls of the die.

20. The method of claim 14, wherein removing the sacrificial film layer exposes the surface of the contact pad.

* * * * *